United States Patent [19]
Gilbert

[11] Patent Number: 5,432,478
[45] Date of Patent: Jul. 11, 1995

[54] LINEAR INTERPOLATION CIRCUIT

[75] Inventor: Barrie Gilbert, Portland, Oreg.

[73] Assignee: Analog Devices, Inc., Norwood, Mass.

[21] Appl. No.: 184,433

[22] Filed: Jan. 21, 1994

[51] Int. Cl.[6] .............................................. H03G 3/00
[52] U.S. Cl. ........................................ 330/284; 330/145
[58] Field of Search ................ 330/144, 145, 284, 285; 333/81 R

[56]  References Cited
U.S. PATENT DOCUMENTS

| | | | |
|---|---|---|---|
| 3,539,831 | 11/1970 | Gilbert | 307/235 |
| 4,476,538 | 9/1984 | Gilbert | 364/817 |
| 5,077,541 | 12/1991 | Gilbert | 330/284 |

FOREIGN PATENT DOCUMENTS

8203979 5/1984 Netherlands .................. 330/284

*Primary Examiner*—Steven Mottola
*Attorney, Agent, or Firm*—Marger, Johnson, McCollom & Stolowitz

[57] ABSTRACT

A linear interpolation network for a continuously variable amplifier. The interpolation network includes first and second control terminals from which complementary scanning input currents are demanded. The network includes a plurality of circuit legs. Each leg includes a current source and a diode connect in series therewith. Coupled between each pair of adjacent circuit legs are first and second shunting diodes. The first shunting diode is connected between the adjacent legs to conduct current in a first direction. The second shunting diode is connected between the adjacent legs to conduct current is a second, opposite direction. The shunting diodes shunt current from the current sources to the control terminals to meet the current demands of the complementary scanning current input signals. The remaining current is sourced by one or more legs such that substantially triangular, overlapping current pulses are produced in the legs responsive to the scanning current inputs. An optional resistor can be coupled between each pair of adjacent legs to "soften" the current through the diodes and introduce a small temperature dependence. A separate rank of output transistors can be used to provide bias currents to individual transconductance stages in the variable amplifier.

29 Claims, 9 Drawing Sheets

LINEAR INTERPOLATION CIRCUIT

BACKGROUND OF THE INVENTION

This invention relates generally to generating variable overlapping currents and more particularly to an interpolation circuit for a variable gain amplifier.

Figure 1:
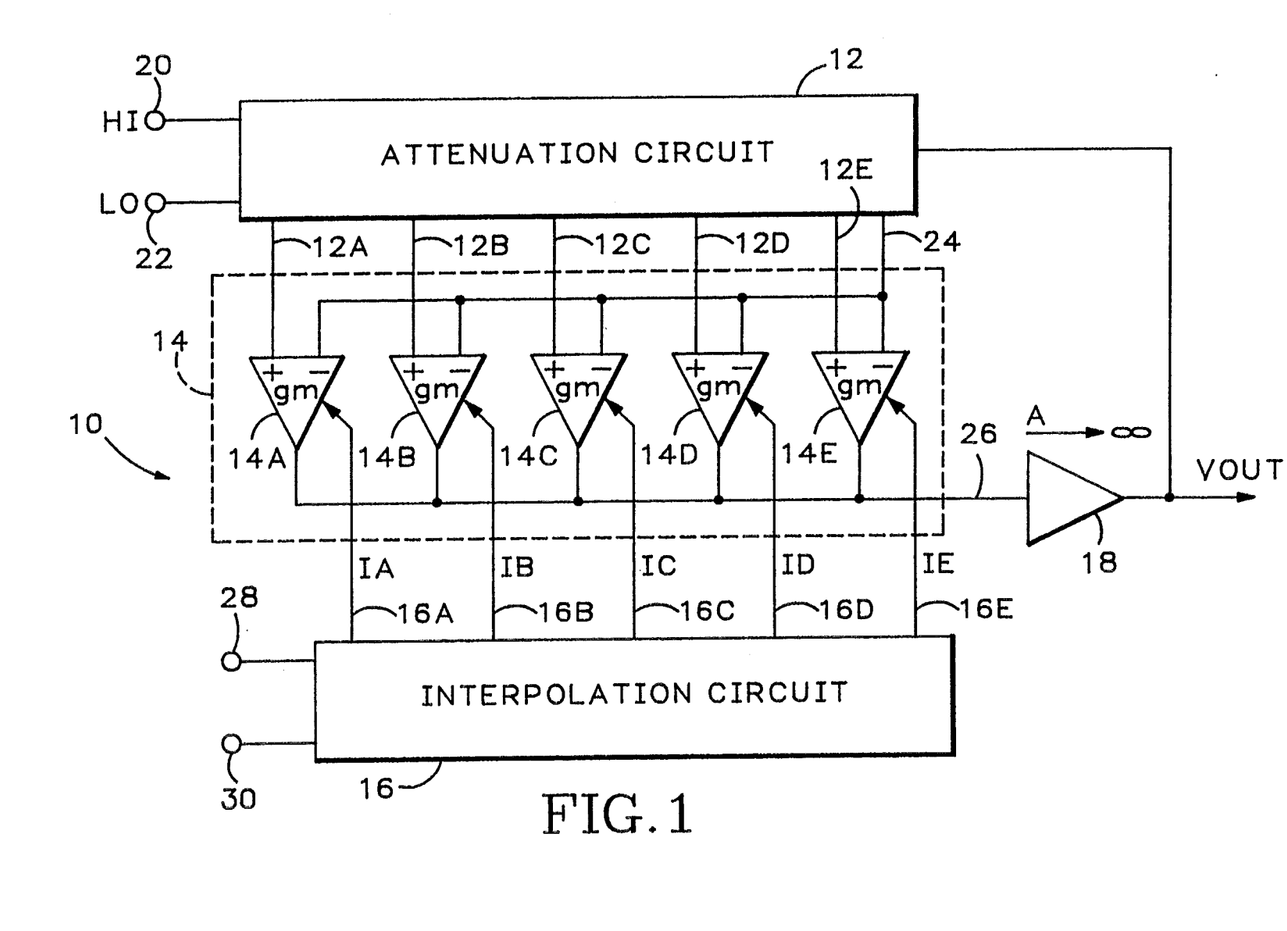
FIG. 1 is a schematic diagram of a variable-gain amplifier using the linear interpolation circuit.

Variable-gain amplifiers have been used for many years, and a wide variety of techniques have been employed for controlling their gain. A block diagram of a variable gain amplifier is shown in FIG. 1. An example of a variable-gain amplifier such as that shown in FIG. 1 is described in my commonly-assigned U.S. Pat. No. 5,077,541, incorporated herein by reference. The variable-gain amplifier described therein uses an interpolation circuit to sequentially "steer" a control current to each of the transconductance ($g_m$) stages in sequence, responsive to an analog control signal as the signal is swept through its dynamic range. The control current activates each $g_m$ stage in sequence, raising the transconductance of each stage from effectively zero to a maximum and then back to zero, in an overlapping fashion, so as to smoothly lower the overall gain of the variable-gain amplifier.

The interpolation circuit, as described in U.S. Pat. No. 5,077,541, essentially produces a plurality of overlapping, exponentially varying currents as the control signal is swept through its entire range. The non-linearities in the current waveforms produce a non-linear gain in the $g_m$ stages as a function of the control signal. In many applications, however, a linear current waveform is required. Accordingly, a need remains for a means for generating a plurality of linear, overlapping currents.

SUMMARY OF THE INVENTION

It is, therefore, an object of the invention to generate a plurality of linear, overlapping currents.

In a preferred embodiment of the invention to be described hereinbelow in detail, a linear interpolation network is described wherein a plurality of linear, overlapping currents are generated responsive to a complementary "scanning" current input signal applied to the network. The network includes two control terminals wherefrom the complementary scanning current inputs are demanded. The network includes a plurality of parallel legs, each supplying a separate precision current. Each leg includes a current source and a load connected in series. Coupled between each pair of adjacent legs are two shunting diodes: a first shunting diode to conduct current in a first direction, and a second shunting diode, coupled in parallel with the first shunting diode, to conduct current in a second direction. The diodes shunt current to one or more circuit legs responsive to the "scanning" input signal such that a series of linear, overlapping currents are produced in the legs.

The complementary scanning input signal demands a complementary current from each control terminal. The scanning input demands a first input current from a first control terminal having an amplitude (A1) according to the following formula:

A1 = (1+X) × $I_X$; and a second complementary input current from a second control terminal having an amplitude (A2) according to the following formula:

A2 = (1−X) × $I_X$, where X is the modulation index and $I_X$ is a predetermined current. The precise value of $I_X$ determines the maximum current level in the circuit legs and, therefore, must meet certain requirements described in detail below. In the preferred embodiment, the first scanning input current is sourced by a first variable current source and the second complementary scanning input current is sourced by a second variable current source.

The linear, overlapping currents produced by the network can be "softened" by further including a resistor in parallel with the first and second shunting resistors. The use of the resistors "soften" the sharp transitions on the individual current pulses through the individual circuit legs, which may be beneficial in certain applications. The "softened" current pulses have a pseudo-Gaussian waveform similar those produced by prior art Gaussian interpolators. Although the resistors introduce a small temperature dependence in the currents, unlike the basic interpolation circuit which is purely translinear, the temperature dependence is significantly less than Gaussian interpolaters.

An important variation of the interpolation circuit is also described herein which demonstrates the general applicability of the linear interpolation techniques described below. A rank of output transistors is further included in the network. The gate of each transistor is coupled to the anode of a diode load in a corresponding circuit leg and the emitters of each transistor are coupled together to form a combined current source. The current produced by the combined current source is proportional to absolute temperature (PTAT).

An advantage of the invention is to reduce the temperature dependence of the overlapping currents.

The foregoing and other objects, features and advantages of the invention will become more readily apparent from the following detailed description of a preferred embodiment of the invention which proceeds with reference to the accompanying drawings.

DETAILED DESCRIPTION

Referring to FIG. 1, a variable gain amplifier is shown generally at 10. The amplifier 10 includes four primary components: an attenuation circuit 12; a transconductance amplifier stage 14; an interpolation circuit 16; and a fixed gain output amplifier 18. The amplifier 10 is shown as an exemplary application for the interpolation circuit 16, which is the focus of the current application. Many other potential applications exist for the interpolation circuit 16, however, as will become apparent to those skilled in the art in view of the description hereinbelow.

In general, the interpolation circuit 16 produces a plurality of currents $I_A$-$I_E$ responsive to an analog "scanning" input signal applied across terminals 28 and 30. The input signal is referred to as "scanning" because in normal operation the signal is swept or scanned through its entire operating range. The interpolation circuit 16 essentially divides the input analog signal into several subdomains, with each subdomain corresponding to one of the currents $I_A$-$I_E$. This behavior is sometimes known as "folding." The folding behavior will become more apparent when the relationship of the currents $I_A$-$I_E$ are examined in detail with respect to FIG. 5.

Although a closed-loop variable gain amplifier is shown in FIG. 1 the invention applies equally as well to open-loop systems, as described further below.

The currents $I_A$-$I_E$ operate as bias currents for corresponding transconductance ($g_m$) amplifiers 14A-14E, respectively. As the bias currents $I_A$-$I_E$ are sequentially generated responsive to the scanning input, the corresponding transconductance amplifiers are sequentially enabled. The enabled transconductance amplifiers amplify a corresponding attenuated input signal supplied by the attenuation circuit 12. The outputs of the transconductance amplifiers are all coupled to the fixed gain amplifier 18 which produces the desired output voltage signal VOUT. Thus, the interpolation circuit 16, by controlling the bias currents $I_A$-$I_E$, controls the overall amplifier gain. Moreover, the interpolation circuit produces a continuously variable gain responsive to the scanning input signal. Although a closed-loop variable gain amplifier is shown in FIG. 1, the invention described herein applies equally as well to closed-loop amplifier designs, as described further below.

Figure 2:
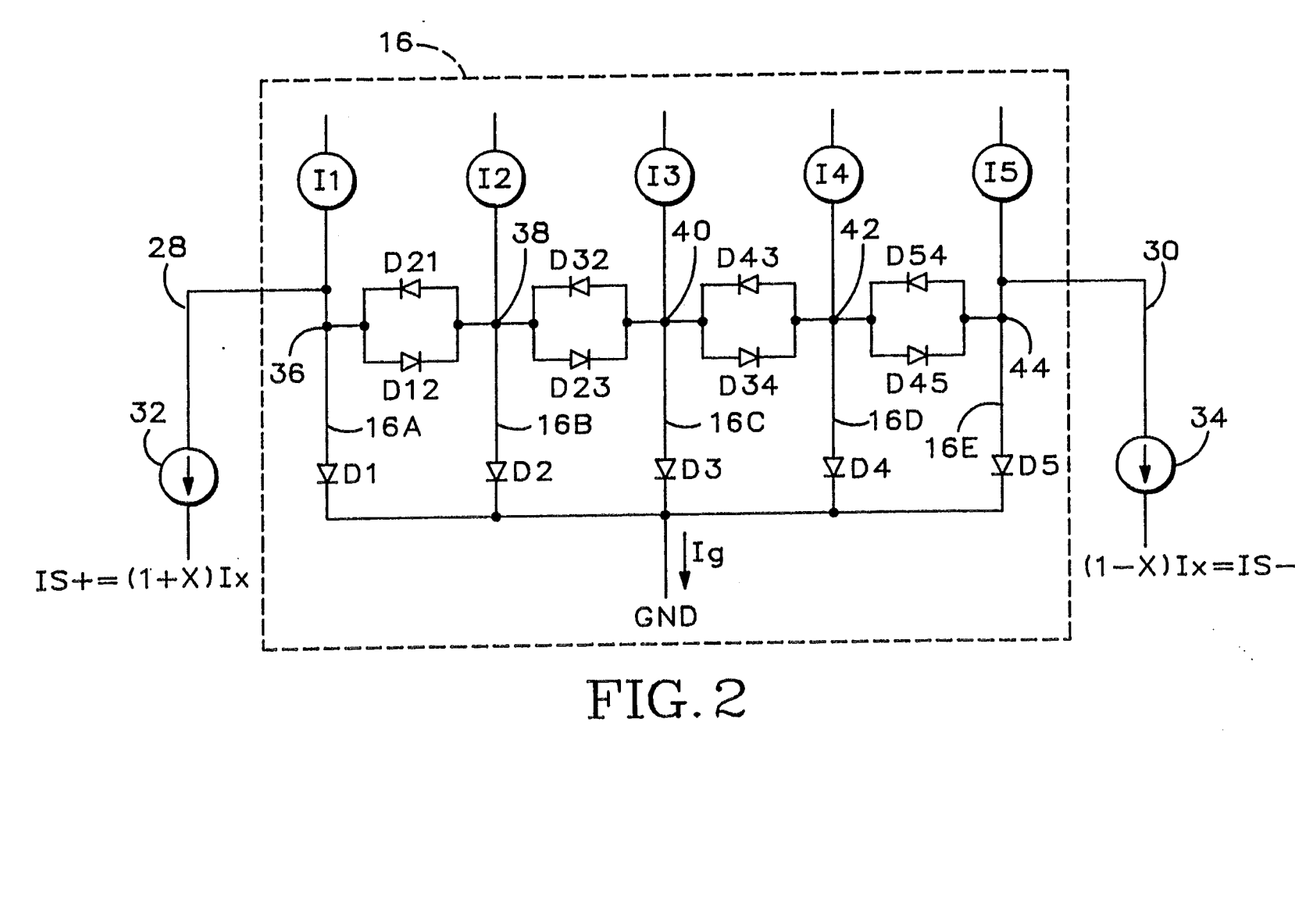
FIG. 2 is a schematic diagram of the linear interpolation circuit of FIG. 1.

The design and operation of the preferred embodiment of the interpolation circuit 16 is described hereinafter with reference to FIG. 2. Although the embodiment shown in FIG. 2 is preferred, it is also exemplary. The interpolation circuit 16 is exemplary in that the circuit includes five sections or "legs". The invention, however, can be extended to any number of sections, odd or even, with the minimum number of legs being two. The exact number of legs is determined by the design application wherein the interpolation circuit 16 is employed.

A interpolation circuit or network 16 constructed in accordance with the present invention is shown in shown in FIG. 2. Circuit 16 includes five legs. Each leg includes a current source, e.g., I1, and a corresponding load or vertical diode, e.g., D1. Each leg provides a separate bias current to the interpolation circuit. Coupled between adjacent leg is a shunting means for shunting current from the current sources to the control terminals 28 and 30 and circuit legs responsive to an input current demand at the control terminals. Variable current sources 32, 34 are described in more detail hereinafter with reference to FIG. 4. In its simplest form the shunting means includes two horizontal diodes, e.g., D21 and D12. The shunting means is coupled between adjacent legs at a node in the leg where the current source and the corresponding vertical diode are connected. For example, the anode of D12 is coupled to node 36 while the cathode of D12 is coupled to node 38 of the adjacent leg. Diode D21 is connected in parallel with D12 but in the opposite polarity. Thus, the cathode of D21 is coupled to node 36 and the anode of D21 is coupled to node 38. Therefore, diode D12 conducts current in one direction while diode D21 conducts in the other. In a similar manner, a separate shunting means is coupled between each successive pair of adjacent legs in an identical manner, as shown in FIG. 2.

The horizontal diodes can be implemented as discrete diodes as shown, or, alternatively, the diodes can be implemented by individual transistors connected in a diode configuration, i.e., the drain connected to the gate. In the preferred embodiment, the H-diodes are Schottky diodes to produce a lower forward voltage drop thereacross. The Schottky diodes can, therefore, be employed in applications where the supply voltages have a more limited operating range.

Figure 3:
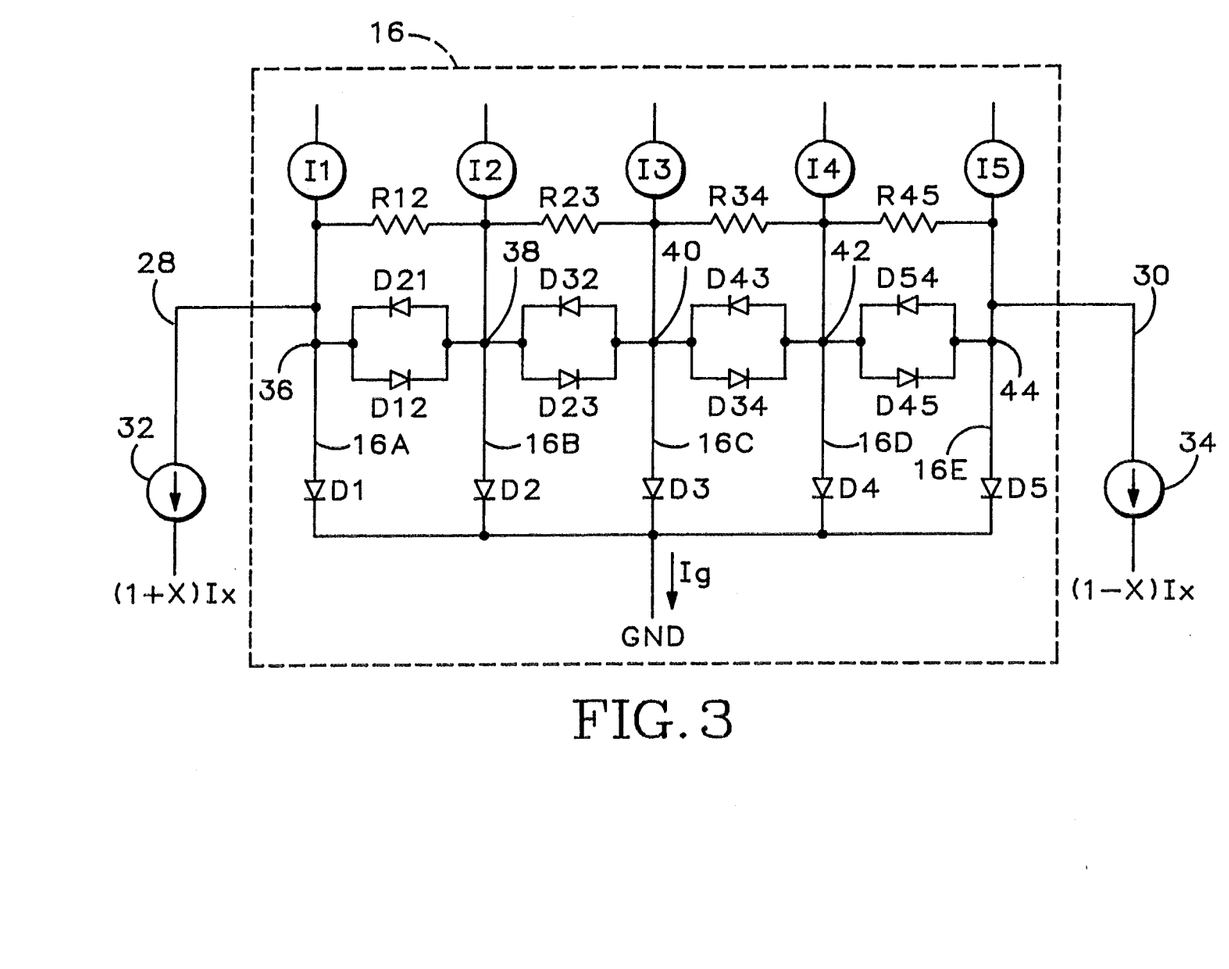
FIG. 3 is a schematic diagram of a second embodiment of the interpolation circuit of FIG. 1.

Referring now to FIG. 3, an alternative embodiment of the interpolation circuit is shown. The alternative embodiment further includes horizontal resistors coupled in parallel with the horizontal diodes. For example, resistor R12 is coupled in parallel with horizontal diodes D21 and D12. Similarly, an additional resistor is coupled between each additional pair of adjacent legs in the interpolation circuit. The resistors shunt the corresponding horizontal diodes. This "softens" the triangular peak of the current pulses through the vertical diodes. This softening effect may be of value in applications where, for example, the sharp current transitions generate unacceptable levels of electromagnetic radiation. The horizontal resistors further introduce a small temperature dependence in the shape of the current pulses through the vertical diodes. Although the temperature dependence may be undesirable in certain applications, the advantages of the softening may outweigh the disadvantages of the temperature dependence. Even with the horizontal resistors, however, the temperature dependence is significantly less than the prior art Gaussian interpolators.

In operation the interpolation circuit 16 in FIG. 2 operates responsive to an analog "scanning" input applied to control terminals 28 and 30. The scanning input includes a pair of currents having complementary values IS+ and IS−. The relationship between the complementary current inputs is given by the following relationships:

$IS+ = (1+X) \times I_X$; and
$IS- = (1-X) \times I_X$, where "X" is the "modulation index" and $I_X$ is a predetermined current which meets certain predetermined conditions. The pair of currents IS+ and IS− demanded at control terminals 28 and 30 are shown as being demanded by variable current sources 32 and 34, respectively. The variable current sources 32 and 34 are shown diagrammatically to indicate that the implementation thereof is not an essential element of the current invention.

Figure 4:
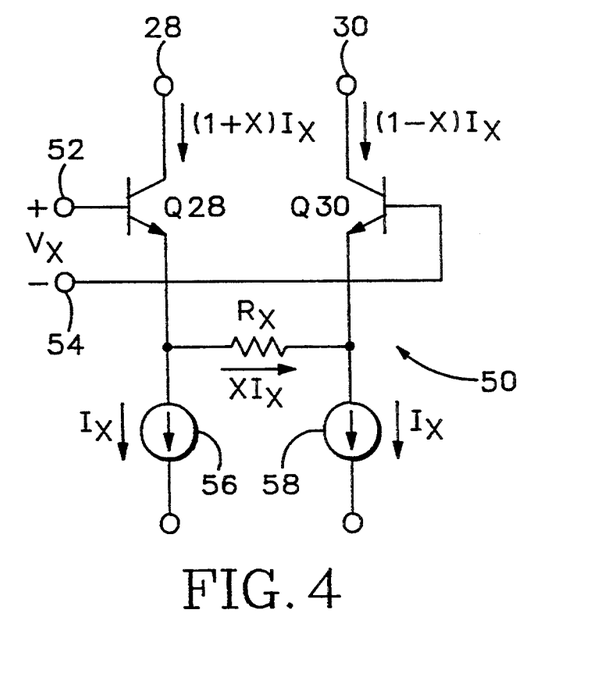
FIG. 4 is a schematic diagram of a variable current source operable in connection with the interpolation circuit of FIG. 1.
Figure 5A:
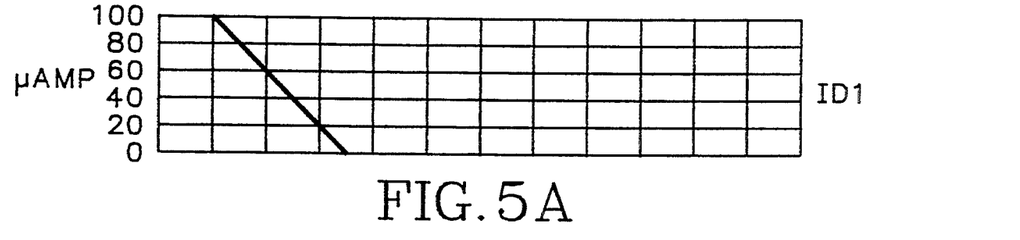
FIG. 5 is a plot of the current pulses through the individual circuit legs of the interpolation circuit of FIG. 2.
Figure 5B:
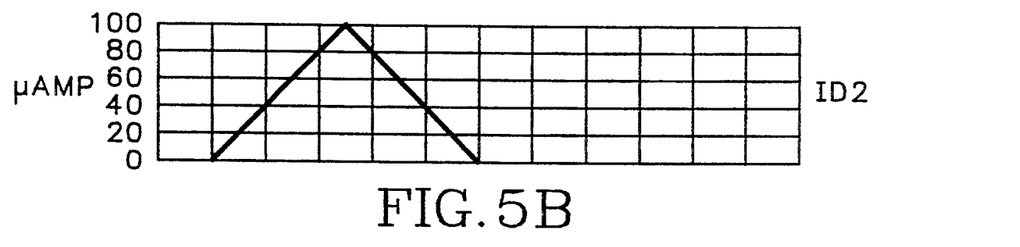
Figure 5C:
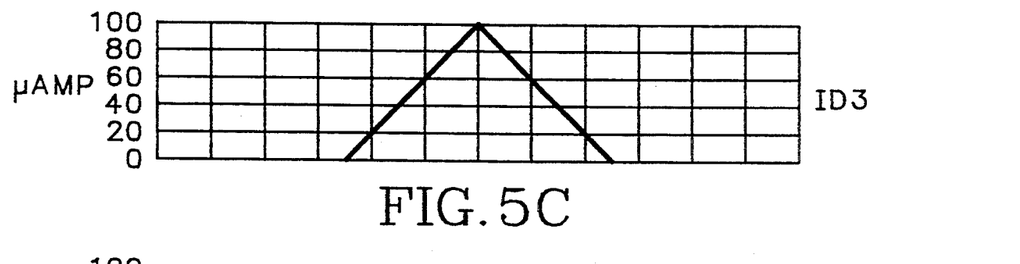
Figures 5D, 5E:
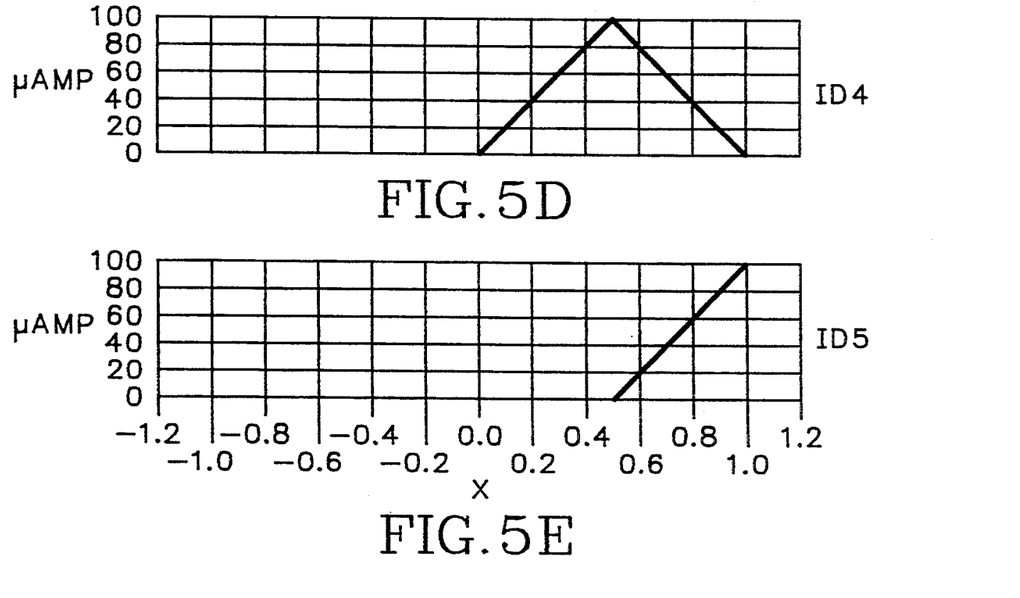

A simple variable current source interface circuit 50 for sinking the complementary scanning currents is shown in FIG. 4. The interface circuit 50 is essentially a voltage to current converter that demands the complementary scanning currents responsive to a scanning voltage signal $V_X$ applied across terminals 52 and 54. The terminals 52 and 54 are connected to the bases of corresponding transistors Q28 and Q30, respectively.

The collector of transistor Q28 is coupled to the control terminal 28 of the interpolation circuit shown in FIG. 2. Similarly, the collector of transistor of Q30 is coupled to the control terminal 30 of the interpolation circuit 16. Current sources 56 and 58 are connected to the respective emitters of transistors Q28 and Q30 for biasing the corresponding input transistor. A resistor $R_X$ is coupled between the emitters of the two input transistors Q28 and Q30 for shunting the current between the two emitters. The interface circuit 50 is but one of a multiplicity of input circuits that can be constructed to demand the scanning input currents. For example, the input transistors Q28 and Q30 could be a Darlington pair, for instance.

The value of $I_X$ generated by current sources 56 and 58 must meet certain conditions. If the value of $I_X$ is too high, the network collapses. If $I_X$ is less than a predetermined critical value, the current segments become trapezoidal, although this trapezoidal behavior may be desirable in certain applications. The most obvious condition that $I_X$ must satisfy follows from Kirkoff's current law as applied to the interpolation circuit of FIG. 2:

$I_X = (N \times I_O - I_G)/2$, where N is equal to the number of legs in the interpolator and $I_O$ is equal to the current supplied by each of the current sources I1-I5. Exactly at the limit condition, i.e., $I_G = 0$, $I_X = N \times I_O/2$. For non-zero values of $I_G$, the selection of $I_X$ determines the peak current through the legs. In the preferred embodiment, $I_X$ is chosen so that $I_G = I_O$, i.e., $I_X = (N-1) \times I_O/2$. Thus, in the case where $I_O = 100$ microamperes (uA) and $N = 5$, $I_X$ is chosen to be equal to be 200 micro-Amperes.

The operation of the interpolation circuit 16 is illustrated with reference to FIG. 5 where the currents through the vertical diodes D1-D5 are plotted as a function of the modulation index X. The plots shown are for the five-section interpolator of FIG. 2 where each of the current sources I1-I5 produces a current $I_O$ equal to 100 uA. The plots show that each current is a piece-wise linear function of the modulation index over a corresponding range. This current behavior, along with the "softened" current behavior described above, is referred to herein as interpolation. Also, for the selected value of the current $I_X$, the sum of the currents through the vertical diodes D1-D5 is substantially constant.

The following analysis considers the operation about a modulation index X equal to zero and $I_O = 100$ uA, however, the operation at or about another modulation index X is essentially identical. For X=0, current $I_G$ flows entirely in diode D3 and all the other vertical diodes are fully off. The demanded 200 uA at each of the control terminals is supplied by I1 and I2 to the left control terminal 28 (with I2 flowing through D21), and by I4 and I5 to the right (with I4 flowing through D45). At this precise point, the states of D32 and D34 are indeterminate and the voltage at control terminal 28 rests at very close to zero volts. If the modulation index X moves slightly positive, the voltage at the control terminal 28 drops abruptly by one forward voltage drop, e.g., approximately 600 mV. The modulation index X moving slightly positive corresponds to an additional incremental current demand at terminal 28 and a corresponding incremental reduction in current demand at terminal 30.

Figure 6:
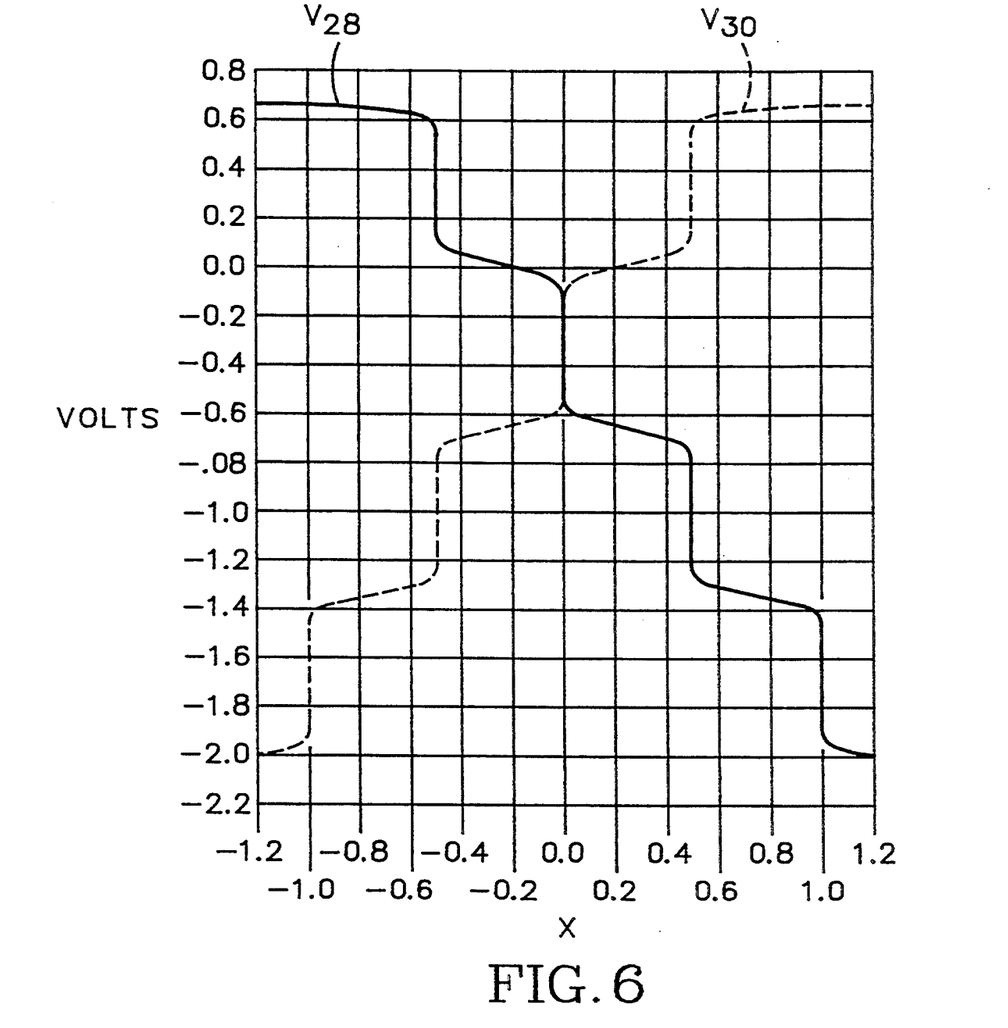
FIG. 6 is a plot of the voltage at the control terminals of the interpolation circuit of FIG. 2.

The resulting voltage behavior at the control terminals 28 and 30, i.e., $V_{28}$ and $V_{30}$, respectively, is shown in FIG. 6. The voltages produces on the control terminals are of little interest, except that they determine the consequential supply voltages required; however, they do aid in understanding the operation of the circuit.

The voltages at the control terminals undergo a series of step transitions at the critical points where one or more of the horizontal diodes begin conducting current. For example, in the case described above where X=0, the incremental current demanded at control terminal 28 is shunted from the current source I3 via diode D32, thereby producing an additional forward diode drop across D32. To minimize the buildup of voltage at the control terminals, as current passes through multiple diodes, Schottky diodes can be employed in applications where the supply voltages have a more limited operating range.

Figure 7:
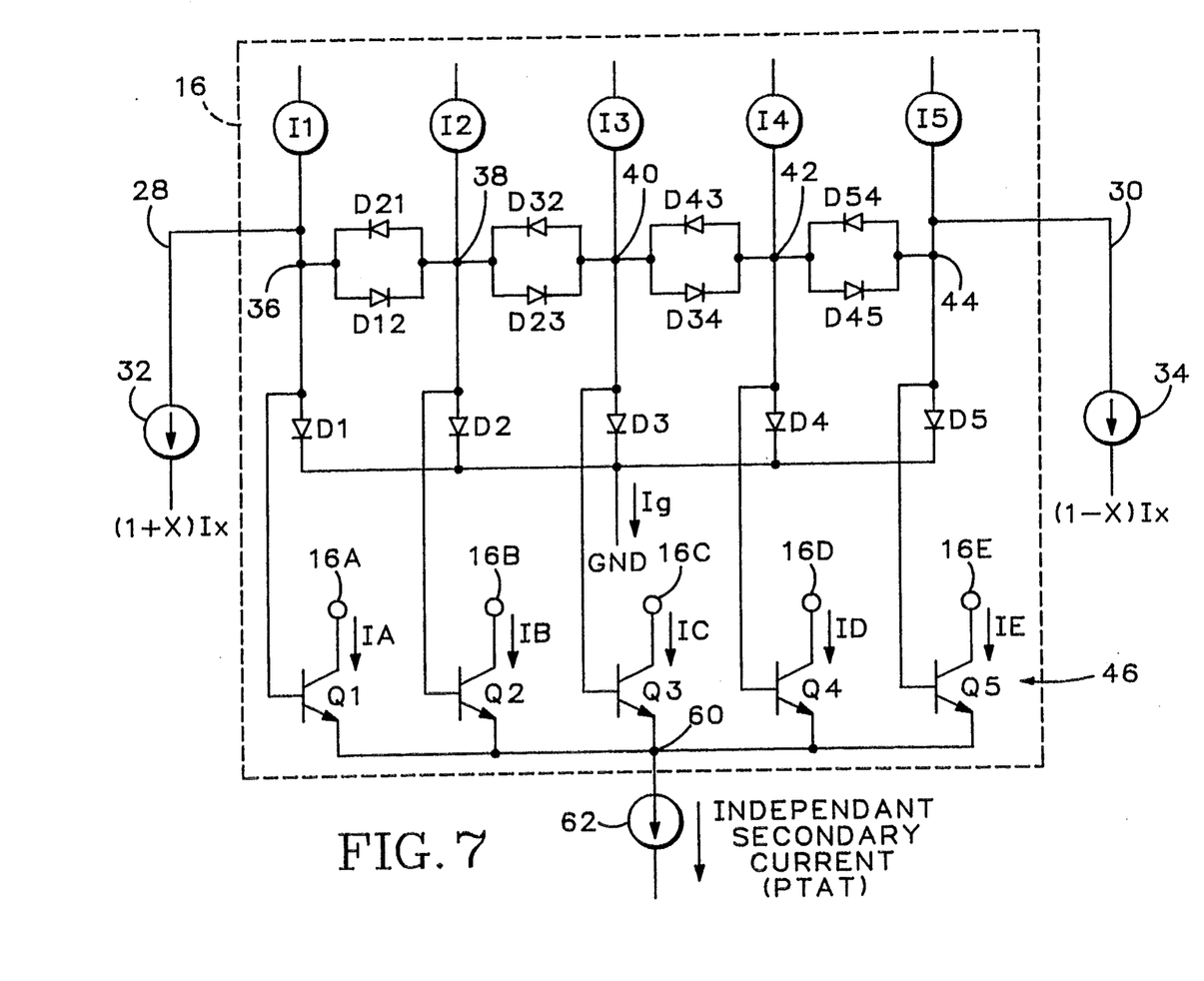
FIG. 7 is a schematic diagram of the interpolation circuit of FIG. 1 having an independent secondary current source that is proportional to absolute temperature (PTAT).

Referring now to FIG. 7, the linear interpolation circuit 16 is employed with a rank of output transistors 46 to sink the transconductance amplifier bias currents $I_A$-$I_E$ as well as generate an independent secondary current. The rank of output transistors 46 includes transistors Q1-Q5 with each being coupled to a corresponding leg in the circuit 16. In the preferred embodiment, transistors Q1-Q5 are bipolar junction transistors, although field-effect-transistors (FET) can also be used. The gate of each transistor is coupled to the anode of the vertical diode in the corresponding circuit leg. The collector of each transistor is connected to the corresponding transconductance amplifier in FIG. 1 to sink the bias current. The emitters of the transistors Q1-Q5 are coupled together at node 60 to form an independent secondary current source 62.

In operation, as current conducts through a given circuit leg a portion of that current is diverted to the gate of the corresponding transistor wherein the transistor begins conducting current. This current biases the corresponding transconductance amplifier which amplifies the input signal. Unlike the current in the circuit legs, however, the current supplied by the transistors is proportional to absolute temperature (PTAT). Therefore, the sum of the transistor currents, which forms the independent secondary current 62, is also a function of the temperature.

Figure 8:
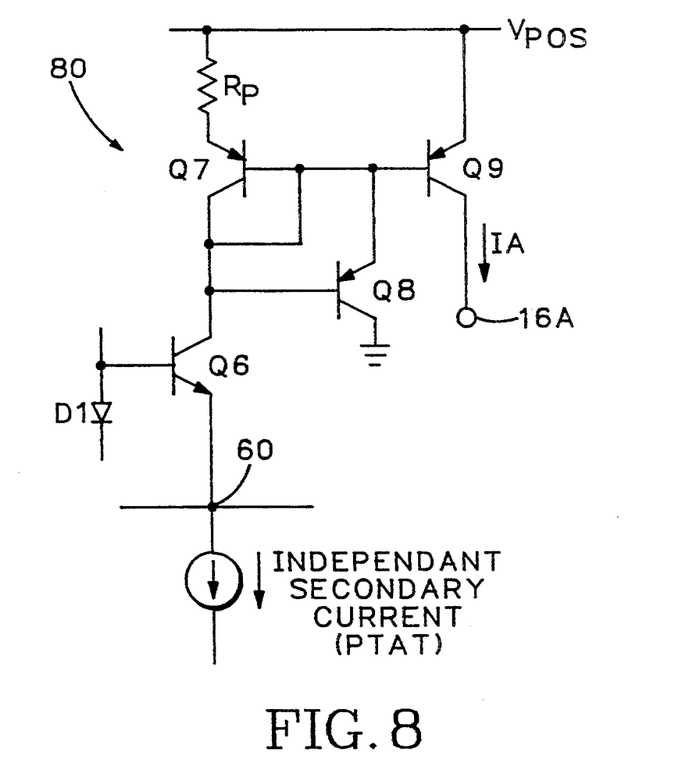
FIG. 8 is a schematic diagram of a representative leg of the secondary current source of FIG. 7 with additional control circuitry for operating the variable-gain amplifier of FIG. 1 in an open-loop configuration.

Referring now to FIG. 8, a circuit for use in open-loop amplifier configurations is shown generally at 80. The circuit 80, including transistors Q6-Q9 and resistor $R_P$, is used in lieu of the individual transistors Q1-Q5 of the current source 46 in FIG. 7 when the interpolation circuit 16 is used in open-loop amplifier configurations. The circuit 80 replaces only a single transistor of the rank of transistors Q1-Q5 and, therefore, the circuit 80 is replicated for each leg in the interpolation circuit. The circuit 80 is a current mirror that produces a controller nonlinearity in the bias current supplied to the corresponding transconductance stage. The controlled nonlinearity is caused by the resistor $R_P$ in the emitter of transistor Q7. In a simplified version transistor Q8 can be eliminated.

Figure 9:
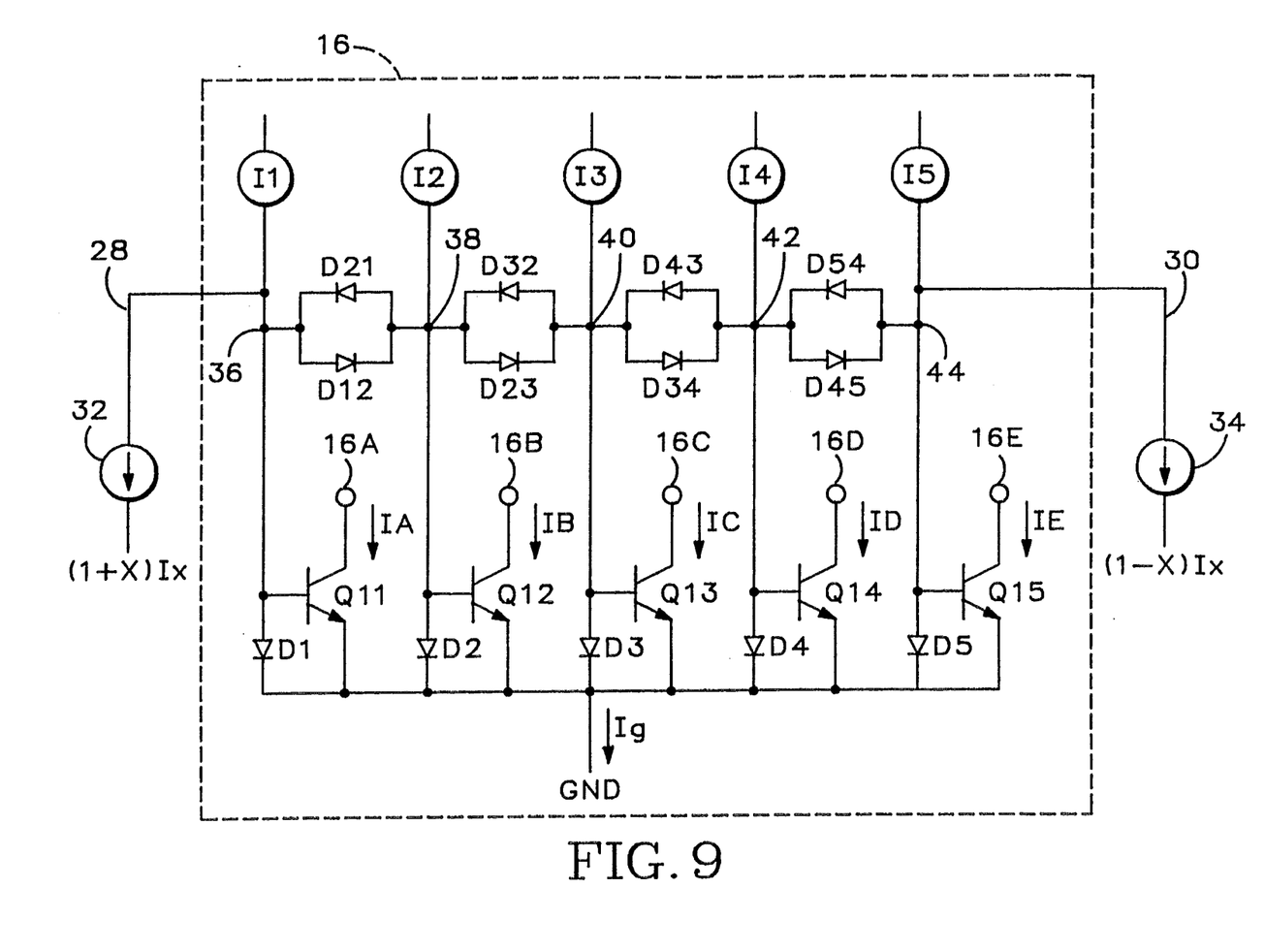
FIG. 9 is a schematic diagram of the interpolation circuit of FIG. 1 having a stepping-stone secondary current source.

Referring now to FIG. 9, a yet further embodiment of the invention is shown. The interpolation circuit 16 shown in FIG. 9 includes a rank of stepping stone transistors Q11-Q15. Each stepping stone transistor is coupled to a corresponding vertical diode. The base of the stepping stone transistor is connected to the anode of the corresponding vertical diode while the emitter of the transistor is coupled to the cathode of the diode. The collector of the stepping stone transistors are coupled to the corresponding transconductance stages in FIG. 1 to sink the bias codes therefrom. Although this stepping stone configuration does produce a current gain between the current in the vertical diode and the current in the corresponding stepping stone transistor, the output currents are bound to have the same temperature coefficient. This temperature dependence, however, may be desirable in certain applications.

Further refinements can be made to the above described circuits to make them more robust for commercial applications. The refinements, however, are not necessary to illustrate the invention and are therefore not described in detail. A few potential refinements include means for clamping the voltages at the control terminals 28 and 30 and means to ensure that the required bias conditions are maintained under worst-case conditions.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. A method of generating a plurality of precision currents, the method comprising:
   supplying a bias current to each of a plurality of legs in an interpolation network;
   demanding a first scanning input current from the network at a first control terminal;
   demanding a second scanning input current from the network at a second control terminal;
   shunting the first and second input currents from the network to the first and second control terminals; and
   producing a linearly interpolated current in one or more legs of the network responsive to the shunting currents.

2. A method of generating a plurality of precision currents according to claim 1 further comprising the steps of:
   demanding an incrementally larger input current from the network at the first control terminal;
   demanding an incrementally smaller input current from the network at the second control terminal;
   shunting current from the network to the first control terminal in an amount equal to the change in current demanded at the first control terminal wherein a corresponding reduction in current in a first network leg is produced; and
   shunting current from the network to a second leg in the network in an amount equal to the change in current demanded at the second terminal wherein a corresponding increase in current in a second network leg is produced.

3. A method of generating a plurality of precision currents according to claim 2 wherein the steps of demanding an incrementally larger input current from the network at the first control terminal and demanding an incrementally smaller input current from the network at the second control terminal include:
   demanding an incrementally larger input current from the network at the first control terminal having an amplitude (A1) according to the following formula:
   $A1 = (1+X) \times I_X$; and
   demanding an incrementally smaller input current from the network at the second control terminal having an amplitude (A2) according to the following formula:

$A2 = (1-X) \times I_X$ where $X$ is the modulation index and $I_X$ is a predetermined current.

4. A method according to claim 3 wherein the amplitude of $I_X$ is determined according to the following formula:
$I_X = (N-1) \times I_O/2$,
where $I_O$ is equal to the amplitude of the bias currents.

5. A method according to claim 1 wherein the step of supplying a plurality of bias currents to an interpolation network comprises supplying a plurality of substantially equal bias currents.

6. A method according to claim 1 wherein the step of supplying a plurality of bias currents to an interpolation network comprises supplying five bias currents.

7. A method according to claim 1 wherein the step of shunting the first and second input currents from the network to the first and second control terminals to produce an interpolated current in one or more legs of the network comprises shunting the first and second input currents from the network to the first and second control terminals to produce a linear interpolated current in one or more legs.

8. An interpolation circuit for providing bias currents to transconductance amplifiers in a variable gain amplifier, the interpolation circuit comprising:
   a network having a plurality of parallel legs for supplying a precision current, each leg having a current source and a load connected in series;
   first and second control terminals coupled to the network;
   a first shunting diode coupled between each pair of adjacent legs to conduct current in a first direction;
   a second shunting diode coupled between each pair of adjacent legs to conduct current in a second direction; and
   means coupled to the loads for providing a bias current to a corresponding transconductance amplifier responsive to a current in the corresponding load.

9. An interpolation circuit according to claim 8 further comprising:
   a first variable current source coupled to the first control terminal; and
   a second variable current source coupled to the second control terminal.

10. An interpolation circuit according to claim 9 wherein the first variable current source sources a current having an amplitude (A1) according to the following formula:
$A1 = (1+X) \times I_X$; and
wherein the second variable current source sources a current having an amplitude (A2) according to the following formula:
$A2 = (1-X) \times I_X$
where $X$ is the modulation index and $I_X$ is a predetermined current.

11. An interpolation circuit according to claim 8 further comprising a resistor coupled between each adjacent leg, each resistor being in parallel with the corresponding first and second shunting diodes.

12. An interpolation circuit according to claim 8 wherein the load in each leg comprises a diode having an anode coupled to the corresponding current source and a cathode coupled to ground.

13. An interpolation circuit according to claim 12 wherein the means coupled to the loads for providing a bias current to a corresponding transconductance amplifier responsive to a current in the corresponding load further includes a plurality of biasing transistors, the collector of each biasing transistor being coupled to a corresponding transconductance amplifier to provide a bias current thereto, the gate of each biasing transistor being coupled to the anode of a diode in a corresponding leg, and the emitter of each biasing transistor being coupled together to form a combined current source.

14. An interpolation circuit according to claim 13 wherein the means coupled to the loads for providing a bias current to a corresponding transconductance amplifier responsive to a current in the corresponding load further includes a plurality of current mirrors, each current mirror coupled between the collector of a corresponding biasing transistor and the corresponding transconductance stage.

15. An interpolation circuit according to claim 14 wherein the current mirrors include:
  a diode-connected transistor having a base connected to a collector and an emitter coupled to the collector of the corresponding biasing transistor;
  a resistor coupled between a positive supply voltage and the emitter of the diode-connected transistor;
  a mirror transistor having a base coupled to the base of the diode-connected transistor, an emitter coupled to the positive supply voltage, and a collector coupled to the corresponding transconductance stage.

16. An interpolation circuit according to claim 15 wherein the current mirrors further include a fourth transistor having an emitter coupled to the base of the mirror transistor, a base coupled to the collector of the biasing transistor, and a collector coupled to ground.

17. An interpolation circuit according to claim 12 wherein the means coupled to the loads for providing a bias current to a corresponding transconductance amplifier responsive to a current in the corresponding load further includes a plurality of biasing transistors, the collector of each biasing transistor being coupled to a corresponding transconductance amplifier to provide a bias current thereto, the gate of each biasing transistor being coupled to the anode of a diode in a corresponding leg, and the emitter of each biasing transistor being coupled to the cathode of the corresponding diode.

18. An interpolation circuit according to claim 8 wherein the plurality of legs includes a leftmost leg and a rightmost leg and wherein the first control terminal is connected to the leftmost leg between the current source and the load of the leftmost leg and wherein the second control terminal is connected to the rightmost leg between the current source and the load of the rightmost leg.

19. An interpolation circuit according to claim 8 wherein the first and second shunting diodes comprise Schottky diodes.

20. An interpolation circuit comprising:
  a network having a plurality of parallel legs for supplying a precision current, each leg having a current source coupled thereto;
  first and second control terminals coupled to the network;
  means for shunting current from the network to the first and second control terminals responsive to an input current demand at the first and second control terminals; and
  means for producing a linearly interpolated current in one or more legs of the network responsive to the shunting current.

21. An interpolation circuit according to claim 20 wherein the shunting means comprises means for shunting current between adjacent legs responsive to the input current demand at the first and second control terminals.

22. An interpolation circuit according to claim 21 wherein the means for shunting current between adjacent legs comprises:
  a first shunting diode means having an anode and a cathode interposed between each pair of adjacent legs, the anode being coupled to a right adjacent leg and the cathode coupled to a left adjacent leg; and
  a second shunting diode means having an anode and a cathode interposed between each pair of adjacent legs, the anode being coupled to the left adjacent leg and the cathode coupled to the right adjacent leg.

23. An interpolation circuit according to claim 22 wherein the first and second shunting diode means are formed of diode connected transistors.

24. An interpolation circuit according to claim 22 further comprising a resistor interposed between each pair of adjacent legs.

25. An interpolation circuit according to claim 20 further comprising:
  a first variable current source coupled to the first control terminal for demanding the first input current therefrom; and
  a second variable current source coupled to the second control terminal for demanding the second input current therefrom.

26. A continuously variable amplifier comprising:
  an attenuation circuit having a pair of input terminals for receiving an input signal, a plurality of taps for providing successively attenuated versions of the input signal, and a common terminal for providing a common output signal;
  a plurality of transconductance stages, each transconductance stage having a first input coupled to a corresponding tap, a second input coupled to the common terminal, an output terminal, and a bias terminal for receiving a bias current;
  an output amplifier having an input terminal having the output terminals of the transconductance stages coupled thereto and an output terminal for providing an output signal; and
  a linear interpolation circuit having a plurality of bias current supplying terminals and first and second control terminals for receiving a pair of complementary scanning input currents, each bias current supplying terminal coupled to a bias terminal of a corresponding transconductance stage for supplying a linearly interpolated bias current thereto responsive to the complementary scanning input currents.

27. A continuously variable amplifier according to claim 26 wherein the interpolation circuit comprises:
  a network having a plurality of parallel legs, each leg having a current source and a load connected in series;
  a first shunting diode coupled between each pair of adjacent legs to conduct current in a first direction;
  a second shunting diode coupled between each pair of adjacent legs to conduct current in a second direction; and
  a rank of output transistors, each output transistor coupled between a load and a transconductance stage to supply a bias current thereto responsive to the current in the corresponding load.

28. A continuously variable amplifier according to claim 26 further comprising:

a first variable current source coupled to the first control terminal for demanding a first scanning current having an amplitude (A1) according to the following formula:

$A1 = (1+X) \times I_X$; and a second variable current source coupled to the second control terminal for demanding a second scanning current having an amplitude (A2) according to the following formula:

$A2 = (1-X) \times I_X$.

where X is the modulation index and $I_X$ is a predetermined current.

29. A continuously variable amplifier according to claim 28 wherein the first and second variable current sources comprise:

a first transistor having collector coupled to the first control terminal, a base, and an emitter;

a first current source coupled to the emitter of the first transistor;

a second transistor having collector coupled to the second control terminal, a base, and an emitter;

a second current source coupled to the emitter of the second transistor; and a resistor coupled between the emitters of the first and second transistors.

* * * * *

UNITED STATES PATENT AND TRADEMARK OFFICE
CERTIFICATE OF CORRECTION

PATENT NO. : 5,432,478
DATED : July 11, 1995
INVENTOR(S) : Barry Gilbert

It is certified that error appears in the above-indentified patent and that said Letters Patent is hereby corrected as shown below:

Column 7, line 38, change "claim I" to --claim 1--;

Column 8, line 9, change "claim I" to --claim 1--;

Column 8, line 13, change "claim I" to --claim 1--;

Column 8, line 16, change "claim i" to --claim 1--;

Signed and Sealed this

Eleventh Day of June, 1996

Attest:

BRUCE LEHMAN

Attesting Officer

Commissioner of Patents and Trademarks